(12) United States Patent
Kruglick

(10) Patent No.: US 9,990,212 B2
(45) Date of Patent: Jun. 5, 2018

(54) TESTING AND REPAIR OF A HARDWARE ACCELERATOR IMAGE IN A PROGRAMMABLE LOGIC CIRCUIT

(71) Applicant: EMPIRE TECHNOLOGY DEVELOPMENT LLC, Wilmington, DE (US)

(72) Inventor: Ezekiel Kruglick, Poway, CA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 178 days.

(21) Appl. No.: 14/360,657

(22) PCT Filed: Feb. 19, 2013

(86) PCT No.: PCT/US2013/026614
§ 371 (c)(1),
(2) Date: May 27, 2014

(87) PCT Pub. No.: WO2014/130005
PCT Pub. Date: Aug. 28, 2014

(65) Prior Publication Data
US 2015/0339130 A1    Nov. 26, 2015

(51) Int. Cl.
*G06F 9/44* (2018.01)
*G06F 11/34* (2006.01)
(Continued)

(52) U.S. Cl.
CPC . *G06F 9/44505* (2013.01); *G01R 31/318519* (2013.01); *G06F 11/277* (2013.01); *G06F 11/3024* (2013.01); *G06F 11/3409* (2013.01)

(58) Field of Classification Search
CPC ......... G01R 31/318519; G06F 11/3024; G06F 11/3409; G06F 11/277; G06F 9/44505
See application file for complete search history.

(56) References Cited

U.S. PATENT DOCUMENTS 5,633,813 A    5/1997  Srinivasan
6,255,849 B1 * 7/2001  Mohan ............ H03K 19/17752
                                                        326/38
(Continued)

FOREIGN PATENT DOCUMENTS

CN    101872315 A    10/2010
TW    200951652 A    12/2009
(Continued)

OTHER PUBLICATIONS

Johnson, Jonathan et al., "Using Duplication with Compare for On-line Error Detection in FPGA-based Designs", IEEEAC Paper #1255, Version 6 Dec. 19, 2007.*
(Continued)

*Primary Examiner* — Jaweed A Abbaszadeh
*Assistant Examiner* — Cheri Harrington

(57) ABSTRACT

Techniques described herein generally include methods for the testing and repair of a hardware accelerator image in a programmable logic circuit. In a processor chip that includes multiple programmable logic circuits, a hardware accelerator image programmed into a first programmable logic circuit is tested by programming a testing circuit with a duplicate hardware accelerator image and bringing the testing circuit to the same logic state as the first programmable logic circuit. Comparing outputs from the first programmable logic circuit and the testing circuit indicates the accuracy of the hardware accelerator image programmed into the first programmable logic circuit. The testing circuit may replace the first programmable logic circuit, or the testing circuit may be reprogrammed for testing other hardware accelerator images programmed into other programmable logic circuits of the processor chip.

22 Claims, 6 Drawing Sheets

(51) Int. Cl.
*G06F 11/30* (2006.01)
*G01R 31/3185* (2006.01)
*G06F 11/277* (2006.01)
*G06F 9/445* (2018.01)

(56) References Cited

U.S. PATENT DOCUMENTS

| | | | | |
|---|---|---|---|---|
| 6,415,384 | B1* | 7/2002 | Dave | G06F 17/5045 |
| | | | | 713/1 |
| 7,906,984 | B1* | 3/2011 | Montminy | H03K 19/17732 |
| | | | | 326/10 |
| 2002/0144177 | A1* | 10/2002 | Kondo | G06F 11/1441 |
| | | | | 714/13 |
| 2002/0157071 | A1* | 10/2002 | Schiefele | G06F 11/1497 |
| | | | | 326/11 |
| 2004/0123258 | A1* | 6/2004 | Butts | G06F 17/5027 |
| | | | | 716/106 |
| 2004/0145947 | A1* | 7/2004 | Micheloni | G11C 16/10 |
| | | | | 365/185.19 |
| 2006/0101307 | A1* | 5/2006 | Rapp | G06F 9/54 |
| | | | | 714/13 |
| 2006/0253762 | A1* | 11/2006 | Schalick | G01R 31/31704 |
| | | | | 714/742 |
| 2009/0198882 | A1* | 8/2009 | Ji | G06F 12/0246 |
| | | | | 711/109 |
| 2011/0154438 | A1 | 6/2011 | Price | |
| 2011/0209021 | A1* | 8/2011 | Sorensen | A61B 7/04 |
| | | | | 714/733 |
| 2012/0096445 | A1* | 4/2012 | Berg | G06F 9/44547 |
| | | | | 717/140 |
| 2013/0014066 | A1 | 1/2013 | Rajarao et al. | |

FOREIGN PATENT DOCUMENTS

| | | |
|---|---|---|
| TW | 201229700 A | 7/2012 |
| WO | 03058486 A1 | 7/2003 |

OTHER PUBLICATIONS

"FCCM 2012: Call for Papers," The 20th Annual International IEEE Symposium on Field-Programmable Custom Computing Machines, Dec. 31, 2011, pp. 3.

"Symantec Enterprise Vault™ Compliance Accelerator", Data Sheet: Messaging Management, accessed at <URL: http://eval.symantec.com/mktginfo/enterprise/fact_sheets/b-datasheet_ent-vault-compliance_accelerator_09-2008_11703649.en-us.pdf>, Sep. 2008, pp. 4.

Ronald F. Demara et al., "Autonomous FPGA Fault Handling Through Competitive Runtime Reconfiguration", in Proceedings 2005 NASA/DoD Conference on Evolvable Hardware, Jun. 29-Jul. 1, 2005, pp. 109-116.

Notification of Transmittal of the International Search Report and the Written Opinion of the International Searching Authority, International Application No. PCT/US2013/026614, dated Feb. 19, 2013.

Edward Stott et al., "Improving FPGA Reliability with Wear-Levelling", 21st International Conference on Field Programmable Logic and Applications, 2011, pp. 323-328, IEEE Computer Society.

"Routine Monitoring and Maintenance for the Accelerator Environment", TECH63230, Symantec, Jan. 12, 2008, Updated on Oct. 5, 2011, article can be access at < URL: http://www.symantec.com/docs/TECH63230>.

Peter Clarke, "Tabula Tips Time-Share FPGA Architecture", EE Times Products, Mar. 1, 2010, Retrieved on Apr. 25, 2012, also available at <URL: http://www.eetimes.com/electronic-products/fpga-pld-products/4115288/Tabula-tips-t>.

Jack Sampson et al., "Efficient Complex Operators for Irregular Codes", IEEE 17th International Symposium on High Performance Computer Architecture (HPCA), 2011, pp. 491-502, IEEE.

Steven Swanson et al., "GreenDroid: Exploring the Next Evolution in Smartphone Application Processors", Integrated Circuits for Communications, IEEE Communications Magazine, Apr. 2011, pp. 112-119, vol. 49, No. 4, IEEE.

Ganesh Venkatesh et al., "Conservation Cores: Reducing the Energy of Mature Computations", ASPLOS'10, Mar. 13-17, 2010, pp. 205-218, ACM.

Andrew G. Schmidt et al., "Checkpoint/Restart and Beyond: Resilient High Performance Computing with FPGAs", IEEE International Symposium on Field-Programmable Custom Computing Machines, 2011, pp. 162-169, IEEE Computer Society.

J. Sampson et al., "Conservation Cores: Energy-Saving Coprocessors for Nasty Real-World Code", available at <URL:http://users.elis.ugent.be/~brdsutte/lctes2011/lctes_2011_taylor.pdf>, LCTES, 2011.

* cited by examiner

TESTING AND REPAIR OF A HARDWARE ACCELERATOR IMAGE IN A PROGRAMMABLE LOGIC CIRCUIT

CROSS REFERENCE TO RELATED APPLICATION

The present application is a U.S. National Stage filing under 35 U.S.C. § 371 of international Application No. PCT/US2013/026614, filed on Feb. 19, 2013, entitled "TESTING AND REPAIR OF A HARDWARE ACCELERATOR IMAGE IN A PROGRAMMABLE LOGIC CIRCUIT." International Application No. PCT/US2013/026614, including any appendices or attachments thereof, is hereby incorporated by reference in its entirety.

BACKGROUND

Unless otherwise indicated herein, the approaches described in this section are not prior art to the claims in this application and are not admitted to be prior art by inclusion in this section.

In keeping with Moore's Law, the number of transistors that can be practicably incorporated into an integrated circuit has doubled approximately every two years. This trend has continued for more than half a century and is expected to continue until at least 2015 or 2020. However, simply adding more transistors to a single-threaded processor no longer produces a significantly faster processor. Instead, increased system performance has been attained by integrating multiple processor cores on a single chip to create a chip multiprocessor and sharing processes among the multiple processor cores of the chip multiprocessor. But even this approach has limitations.

With each successive process generation, the percentage of a chip that can actively switch drops due to limitations on threshold voltage scaling related to power use and heat dissipation. Thus, in a few process generations, chip multiprocessors will only be able to make use of a small fraction of a silicon die at full frequency at once. This "utilization wall" will prevent massively multi-core processors from effectively employing more than a small subset of cores at once, which undermines the utility of building high core-count processors. In addition, the expanded use of mobile computing devices makes the execution of complex code at minimum power highly desirable in multi-core processors.

Hardware accelerators offer the best solution to meet the demand for maximum performance using minimum power. A hardware accelerator generally includes separate logic circuits from the central processing unit of a computing device, and is used to perform certain functions faster than is possible in software running on a general-purpose central processing unit. To that end, hardware accelerators may be programmable to allow specialization to a particular task or function, and consist of a combination of software, hardware, and firmware. Typically, hardware accelerators are designed for computationally intensive software code, and can vary from a small functional unit, such as a floating-point accelerator, to a large functional block, such as a graphics processing unit.

SUMMARY

In accordance with at least some embodiments of the present disclosure, a method for implementing an accelerator program on one of the multiple programmable logic circuits in a processor is generally described. Example methods described herein may include providing inputs associated with the application to a first programmable logic circuit of the processor that is programmed with an accelerator program associated with the application and monitoring outputs from the first programmable logic circuit that result from providing the inputs, wherein the outputs from the first programmable logic circuit are used by the processor to run the application. Some example methods may include providing the inputs to a second programmable logic circuit of the processor that is programmed with the accelerator program and monitoring outputs from the second programmable logic circuit that result from providing the inputs to the second programmable logic circuit. In some examples, the outputs from the first programmable logic circuit are compared to the outputs from the second programmable logic circuit. Based on the comparison of the outputs, the outputs from the second programmable logic circuit may be used to run the application.

In accordance with at least some embodiments of the present disclosure, a method for implementing an accelerator program on one of the multiple programmable logic circuits in a processor is generally described. Example methods described herein may include providing inputs associated with the application to a first programmable logic circuit of the processor that is programmed with an accelerator program associated with the application and monitoring outputs from the first programmable logic circuit that result from providing the inputs, wherein the outputs from the first programmable logic circuit are used by the processor to run the application. Some example methods may further include providing the inputs to a second programmable logic circuit of the processor that is programmed with the accelerator program and monitoring outputs from the second programmable logic circuit that result from providing the inputs to the second programmable logic circuit. In some examples, the outputs from the first programmable logic circuit are compared to the outputs from the second programmable logic circuit. Based on the comparison of the outputs, the second programmable logic circuit may be programmed with a different accelerator program.

In accordance with at least some embodiments of the present disclosure, a method for testing an accelerator program that is programmed into one of the multiple programmable logic circuits in a processor is generally described. Example methods described herein may include providing test vector inputs to a first programmable logic circuit of the processor that is programmed with an accelerator program, the test vector being associated with the accelerator program and monitoring outputs from the first programmable logic circuit that result from providing the test vector inputs. Some example methods may further include providing the test vector inputs to a second programmable logic circuit of the processor that is programmed with the accelerator program and monitoring outputs from the second programmable logic circuit that result from providing the test vector inputs to the second programmable logic circuit. In some examples, the outputs from the first programmable logic circuit are compared to the outputs from the second programmable logic circuit. Based on the comparison of the outputs, a health status of the first programmable logic circuit may be updated.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. The disclosure will be described with additional specificity and detail through use of the accompanying drawings.

DETAILED DESCRIPTION

Figure 1:
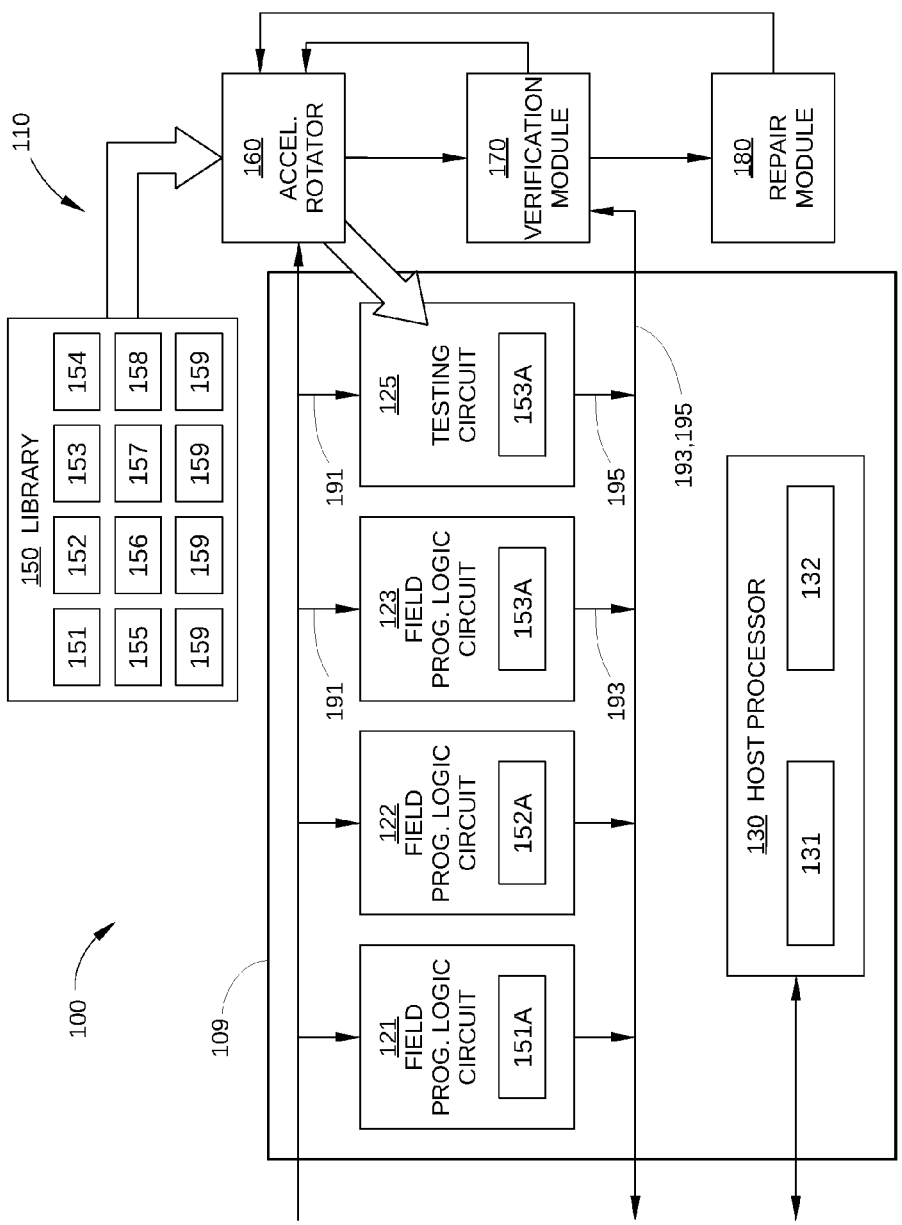
FIG. 1 shows a block diagram of an example embodiment of a chip multiprocessor.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

As noted above, hardware accelerators are well-suited for providing high-speed processing with reduced power use. Currently, hardware accelerators may be implemented as either fixed hardware, such as application-specific integrated circuits (ASICs), or may be built on top of programmable logic circuits, such as field-programmable gate array chips (FPGAs), which can be configured in the field as an accelerator for a particular software application. Implementing hardware acceleration in fixed hardware has the disadvantages of longer and more expensive design cycles, the risk of expensive product recalls if errors are found in the fixed silicon implementation, and the inability to upgrade fixed silicon functions in deployed products when newly developed features are added to any applications for which the hardware accelerator is designed. Consequently, hardware accelerators built on programmable logic circuits that can be reconfigured with architecture associated with a particular application are highly desirable.

A notable disadvantage of field-programmable logic circuits is that they generally have much higher error rates than conventional logic circuits. Examples of the failure modes in a field-programmable logic circuit that can produce such errors include charge trapping, heat-induced gate fails, thermal fatigue, programming oxide breakdown, radiation induced errors, negative-bias temperature instability, and hot-carrier injection, among others. These failure modes may occur due to faults in the programming of a logic circuit and/or due to degradation of the programmed logic circuit over time. While the use of built-in self-test (BIST) circuits for monitoring the accuracy of output from logic circuits is known, reprogrammable hardware accelerators inherently do not have a single known output for a given input, therefore rendering BIST circuits generally unusable for reprogrammable hardware accelerators. Furthermore, in some instances, reprogrammable hardware accelerators are specifically designed as simple circuits that occupy a relatively small portion of a processor chip. Inclusion of a corresponding BIST circuit on a processor chip that is complex in design (and therefore more susceptible to design and manufacturing flaws) and is larger in size than the reprogrammable circuit being tested negates key advantages of the reprogrammable circuit.

Example embodiments of the present disclosure relate to hardware accelerators, and more particularly to a method for the testing and repair of a hardware accelerator image in a programmable logic circuit. Specifically, in a processor chip that includes multiple programmable logic circuits, a hardware accelerator image programmed into a first programmable logic circuit is tested by programming a testing circuit with a duplicate hardware accelerator image and bringing the testing circuit to the same logic state as the first programmable logic circuit. Comparing outputs from the first programmable logic circuit and the testing circuit indicates the accuracy of the hardware accelerator image programmed into the first programmable logic circuit. In some embodiments, the testing circuit replaces the first programmable logic circuit, so that the hardware accelerator image of interest is implemented in a recently programmed logic circuit. In other embodiments, the testing circuit is reprogrammed for testing other hardware accelerator images programmed into other programmable logic circuits of the processor chip.

FIG. 1 shows a block diagram of an example embodiment of a chip multiprocessor (CMP) 100, arranged in accordance with at least some embodiments of the present disclosure. CMP 100 is a chip multiprocessor that is formed on a single integrated circuit die 109 and may be configured to carry out one or more processing tasks in parallel. CMP 100 includes multiple field-programmable logic circuits 121-123 and a testing circuit 125 formed on integrated circuit die 109. Field-programmable logic circuits 121-123 and testing circuit 125 can each be programmed with a desired hardware accelerator image and therefore configured as hardware accelerators for the processing of one or more applications run on CMP 100. In some embodiments, CMP 100 also includes a host processor 130 formed on integrated circuit die 109. Host processor 130 may be configured as a central processing unit (CPU) or other general purpose processor and may include an instruction buffer 131 and/or a data buffer 132, which are sometimes referred to together as "L1 cache."

Generally, CMP 100 may be included as part of a host computing device (not shown in FIG. 1). In some embodiments, such a computing device may be a mobile computing device, such as a smart phone, electronic tablet, digital personal assistant, laptop computer, and the like. In other embodiments, the host computing device that includes CMP 100 may make up a part of a cloud computing infrastructure configured to provide Internet-based computing. In yet other embodiments, the host computing device that includes CMP 100 may be a conventional desktop computer or an appliance or other electronic device that is integrated into a ubiquitous computing environment.

Field-programmable logic circuits 121-123 and testing circuit 125 are integrated logic circuits that are designed to be configured by a user or designer after manufacturing and are therefore "field-programmable." In some embodiments, one or more of field-programmable logic circuits 121-123 and/or testing circuit 125 comprise a field-programmable gate array (FPGA), which can be used to implement any logical function that can be performed by an application-specific integrated circuit (ASIC). Unlike ASICs, field programmable logic circuits 121-123 and testing circuit 125 can be partially re-configured and/or have functionality updated after manufacturing by being programmed with an appropriate hardware accelerator image. Consequently, each of field-programmable logic circuits 121-123 and testing circuit 125 can be reprogrammed as desired during operation with a hardware accelerator image and function as a hardware accelerator for a specific application. To that end, one or more of field-programmable logic circuits 121-123 and/or testing circuit 125 may include programmable logic components referred to as "logic blocks" and a hierarchy of reconfigurable interconnects that allow the logical blocks to be inter-wired in different configurations. Such logic blocks can be configured to perform complex combinational functions or simple logical functions, such as AND and XOR. In some embodiments, one or more of field-programmable logical circuits 121-123 and/or testing circuit 125 may also include memory elements, which may comprise simple flip-flops and/or more complete blocks of memory.

In the embodiment illustrated in FIG. 1, CMP 100 is depicted with three field-programmable logic circuits 121-123. In other embodiments, CMP 100 may include more than or fewer than three field-programmable logic circuits. In some embodiments, CMP 100 may be configured as a high core-count chip multiprocessor with a plurality of conventional processor cores instead of a single host processor like host processor 130.

In some embodiments, field-programmable logic circuits 121-123 and/or testing circuit 125 may be designed to be programmed with architecture associated with specific applications installed on the computing device that includes CMP 100. For example, each of field-programmable logic circuits 121-123 and/or testing circuit 125 may be configured as an updatable, software-specific hardware accelerator, such as one of hardware accelerator images 151A-153A, described below. In such embodiments, field-programmable logic circuits 121-123 and/or testing circuit 125 may also be configured to occupy minimal footprint on integrated circuit die 109, being as small as one tenth the size of a conventional processor core. When programmed as software-specific hardware accelerators, e.g., hardware accelerator images 151A-153A, field-programmable logic circuits 121-123 and/or testing circuit 125 may be quite shallow in terms of the number of different logic states that can be held. Consequently, field-programmable logic circuits 121-123 and/or testing circuit 125 can be placed in a known logic state after a small number of operations. In other words, the logic status of any flip-flops, accumulators, counters, state machines, or memory in a particular field-programmable logic circuit or of testing circuit 125 of interest are then in a known state. This property of field-programmable logic circuits 121-123 and testing circuit 125 is utilized in some embodiments of the disclosure, described below.

In the embodiment illustrated in FIG. 1, field-programmable logic circuits 121-123 are programmed with hardware accelerator images 151A-153A, respectively; however, field-programmable logic circuits 121-123 may be programmed with any combination of hardware accelerators available from hardware accelerator packages 151-158 stored in library 150 without exceeding the scope of the disclosure. Library 150, hardware accelerator images 151A-153A, and hardware accelerator packages 151-158 are described below. Hardware accelerator image 151A can be programmed into field-programmable logic circuit 121 (or into field-programmable logic circuits 122-123 and/or testing circuit 125) using hardware accelerator package 151, either when hardware accelerator package 151 is first received by CMP 100 or at any time that it is desired that one of field-programmable logic circuits 121-123 and/or testing circuit 125 be programmed with hardware accelerator 151A. In a similar fashion, hardware accelerator image 152A can be programmed into a any of field-programmable logic circuits 121-123 and/or testing circuit 125 using hardware accelerator package 152, and hardware accelerator image 153A can be programmed into any of field-programmable logic circuits 121-123 and/or testing circuit 125 using hardware accelerator package 153.

In some embodiments, testing circuit 125 may be substantially similar in size, complexity, memory element make-up, and physical circuit configuration to field-programmable logic circuits 121-123. In other embodiments, testing circuit 125 may have a physical configuration that is suited for being frequently reprogrammed. For example, in one such embodiment, testing circuit 125 may comprise a static random-access memory (SRAM) programmable configuration, while field-programmable logic circuits 121-123 comprise an electrically erasable programmable read-only memory (EEPROM). Thus, in such an embodiment, testing circuit 125 can be reprogrammed continuously without degradation, while field-programmable logic circuits 121-123 may be reprogrammed when errors are detected therein.

FIG. 1 also depicts components of an accelerator management system 110 that can facilitate implementation of one or more embodiments of the disclosure in conjunction with CMP 100. Accelerator management system 110 is a maintenance circuit that may include one or more of a library 150, an accelerator rotator 160, a verification module 170, and a repair module 180, and may be configured to periodically test and repair hardware images programmed into field-programmable logic circuits 121-123 during operation of CMP 100. In addition, accelerator management system 110 may be configured to store reliability and/or operational status of field-programmable logic circuits 121-123. One or more of the elements of accelerator management system 110 may be implemented as elements formed on integrated circuit die 109, or may reside off-chip. In the embodiment illustrated in FIG. 1, elements of accelerator management system 110 are depicted as off-chip elements.

Library 150 stores hardware accelerator packages 151-158 and in some embodiments test vectors 159 that are each associated with software applications installed on the host computing device that includes CMP 100. Specifically, each of hardware accelerator packages 151-158 is configured to program a suitable field-programmable logic circuit in CMP 100 with a specific hardware accelerator image, such as hardware accelerator images 151A, 152A, and 153A. Each of hardware accelerator images 151A, 152A, and 153A may be designed for running the computationally intensive software code of a particular software application or family of related applications. To that end, each of hardware accelerator images 151A, 152A, and 153A can vary from a small functional unit, such as a floating-point accelerator, to a large functional block, such as a graphics processing unit. In some embodiments, hardware accelerator packages 151-158 stored in library 150 include hardware accelerator packages that are downloaded when associated software applications are initially installed on said host computing device, when the associated applications are updated, and, in some embodiments, during the manufacture of CMP 100. Library 150 may include on-chip memory, off-chip memory, or a combination of each. Library 150 may be implemented on-chip as one or more non-volatile memory blocks formed on integrated circuit die 109, such as flash memory or phase-change memory. Library 150 may be implemented as off-chip memory as a portion of a hard disk drive, flash memory, or other non-volatile storage.

Accelerator rotator 160 programs testing circuit 125 with one of the hardware accelerator images currently programmed into either field-programmable logic circuit 121, 122, or 123. With a selected hardware accelerator image programmed into one of field-programmable logic circuits 121-123 and also into testing circuit 125, error-free operation of the selected hardware accelerator image can be verified without the use of test vectors 159. Such verification is accomplished by providing identical inputs 191 to testing circuit 125 and to the field-programmable logic circuit being tested. In the example illustrated in FIG. 1, field-programmable logic circuit 123 and testing circuit 125, which are each programmed with hardware accelerator image 153A, receive inputs 191. Hardware accelerator image 153A in field-programmable logic circuit 123 generates outputs 193, which are used by CMP 100 to run a portion of an application. Simultaneously, hardware accelerator image 153A in testing circuit 125 generates output 195. Accelerator maintenance system 110 then compares outputs 193 and outputs 195 to determine the error-free operation of the hardware accelerator image programmed into field-programmable logic circuit 123. In the embodiment illustrated in FIG. 1, verification unit 170 of accelerator maintenance system 110 performs the above-described verification process, and is described below.

Failures in a reprogrammable logic circuit can have multiple sources, including errors in the initial programming of the logic circuit and wear-out mechanisms resulting from degradation of the logic circuit over time, among others. Consequently, the selection process used by accelerator rotator 160 to select a particular hardware accelerator image for testing may be based on various criteria. For example, in some embodiments, a particular hardware accelerator image programmed into one of field-programmable logic circuits 121-123 is duplicated in testing circuit 125 for testing by accelerator rotator 160 after the hardware accelerator image has been used for a predetermined time period in one of field-programmable logic circuits 121-123. In other embodiments, a hardware accelerator image is duplicated for testing in testing circuit 125 after performing a predetermined number of operations. In other embodiments, a hardware accelerator image is duplicated for testing in testing circuit 125 when an error is experienced by an application associated with the hardware accelerator image, such as a "force close" event and the like. In such embodiments, an indicator from an operating system associated with CMP 100, a core within the processor, etc. may be provided to accelerator maintenance system 110. For example, errors commonly raise an exception signal at host processor 130, and such exception signals can be captured if the code represents an instruction segment or address segment associated with the accelerator that experiences the error. In an alternative example, an operating system associated with CMP 100 may signal an error and the type using a purpose-made instruction for doing so provided by the maintenance system 110.

In yet another example, the accelerators themselves may involve exception raising logic and the exceptions may be observed at the output being snooped by verification module 170.

In yet other embodiments, a hardware accelerator image is duplicated for testing in testing circuit 125 when the computing device that includes CMP 100 is connected to a power supply external to the computing device. Processors such as CMP 100 typically have different power modes that are activated by power management logic or an operating system associated with CMP 100. These power modes can be sensed and action taken when a host computing device of CMP 100 is in "high power" configurations, for example when a user or the operating system has set such actions to occur when the host computing device is plugged in. Messages related to charging status are also typically directly available from a system-on-chip or power management unit associated with CMP 100, since modern mobile devices generally perform various computational activities during charging to maximize battery longevity and performance. Such embodiments are particularly advantageous when said computing device comprises a mobile computing device, since programming field-programmable logic circuits may be relatively power intensive.

In some embodiments, a hardware accelerator image may be selected for duplication and testing by accelerator rotator 160 when the accelerator image is initially programmed into one of field-programmable logic circuits 121-123, thereby ensuring the detection of errors in the initial programming of the hardware accelerator image. In still other embodiments, the relative frequency of testing of a particular hardware accelerator image may be increased based on the age or write cycle count of the field-programmable logic circuit the hardware accelerator image is programmed into. Of course, any combination of the above-described selection criteria, as well as other selection criteria, may be used by accelerator rotator 160 without exceeding the scope of the disclosure.

Verification module 170 is configured to perform a verification process confirming that the operation of a selected hardware accelerator image is error-free. Generally, identical inputs 191 are provided to testing circuit 125 and to the field-programmable logic circuit currently being testing, and verification module 170 compares outputs 193 and 195. In some embodiments, inputs 191 may be inputs provided to the field-programmable logic circuit being tested as part of the normal operation of CMP 100. In such embodiments, outputs 193 are used by CMP 100 to run a portion of an application.

In some embodiments, verification module 170 compares outputs 193 and 195 after testing circuit 125 is initialized to the same logic state as the field-programmable logic circuit being tested. For embodiments of CMP 100 in which field-programmable logic circuits 121-123 are programmed with hardware accelerator images having relatively simple architectures, a relatively small number of inputs, e.g., 2-10, may be needed to bring testing circuit 125 to the same logic state as the field-programmable logic circuit being tested, i.e., the logic status of any flip-flops, accumulators, counters, state machines, or memory of testing circuit 125 are identical to those of the field-programmable logic circuit of interest. In some embodiments, a predetermined number of identical inputs 191 are provided to testing circuit 125 and to the field-programmable logic circuit being tested before verification module 170 compares outputs 193 to outputs 195. The predetermined number may be selected to provide a desired level of statistical confidence that testing circuit 125 and the field-programmable logic circuit being tested are both in identical logic states. It is noted that the logic state of each of field-programmable logic circuits 121-123 is not to be confused with the operational and/or reliability status of field-programmable logic circuits 121-123; the logic state being a function of the particular inputs provided to a programmable logic circuit and the operational and/or reliability status of a programmable logic circuit generally varying over time due to wear-out errors and the like.

Verification of the error-free performance of a particular hardware accelerator image in CMP 100 in the above-described fashion is highly desirable. This is because test vectors, i.e., specifically designed sets of inputs for testing a particular hardware design, are generally not available for some or possibly any of the hardware accelerator images that may be programmed into field-programmable logic circuits 121-123. This is due to the large number of software-specific hardware accelerators that may be developed for CMP 100, the fact that the implementation of such test vectors may be more involved than design of the hardware accelerator image being tested, and the relative frequency at which such hardware accelerator images may be updated.

Repair module 180 is configured to update the health status of tested field-programmable logical circuits 121-123 and to take corrective action. For example, when verification unit 170 determines outputs 193 and 195 to be identical, repair module 180 may indicate the health status of the field-programmable logic circuit being tested as healthy in a health status table maintained by repair module 180. In some embodiments, repair module 180 may then notify accelerator rotator 160 to program testing circuit 125 with a different hardware accelerator image in order to verify the performance of another of field-programmable logic circuits 121-123. Accelerator rotator 160 then selects a different hardware accelerator image for programming into testing circuit 125, as described above.

When verification unit 170 determines outputs 193 and 195 to be different, repair module 180 may indicate the health status of the field-programmable logic circuit being tested as "invalid for use" in a health status table maintained by repair module 180. In addition, repair module 180 may take some form of corrective action. For example, in one embodiment, repair unit 180 may notify accelerator rotator 160 to reprogram testing circuit 125 with the same accelerator hardware image in order to repeat testing of the accelerator hardware image and confirm that the difference between outputs 193 and 195 is not due to an error in the programming of testing circuit 125. In another embodiment, repair module 180 may notify accelerator rotator 160 to program a different one of field-programmable logic circuits 121-123 with the hardware accelerator image that has failed verification testing. In this way, CMP 100 may continue to benefit from the use of hardware acceleration for a particular application after a hardware accelerator for the application has been determined to have errors. In another embodiment, repair module 180 may notify accelerator rotator 160 to reprogram the field-programmable logic circuit that is programmed with the invalid hardware accelerator image, since most error in field-programmable logic circuits can be reset by reprogramming. In such an embodiment, outputs 193 from the newly programmed hardware accelerator image may then be compared to outputs 195 from testing circuit 125 to verify that the newly programmed hardware accelerator image is error-free. If the field-programmable logic circuit continues to provide erroneous output after reprogramming, repair module 180 may indicate in the health status table that said field-programmable logic circuit is either permanently unusable or should undergo more extensive testing, if such testing capability is available. Other corrective action may also be taken by repair module 180 without exceeding the scope of the disclosure.

The health status table of each of field-programmable logic circuits 121-123 may be maintained by repair module 180 and may be disposed on integrated circuit die 109, off of integrated circuit die 109, or a combination of both. For example, health status of one or more field-programmable logic circuits 121-123 may be stored on a hard disk drive or flash memory associated with CMP 100, either as a back-up or as the storage location of health status information. In some embodiments, for reduced latency, health status information associated with field-programmable logic circuits 121-123 may be stored locally on integrated circuit die 109.

Figure 2:
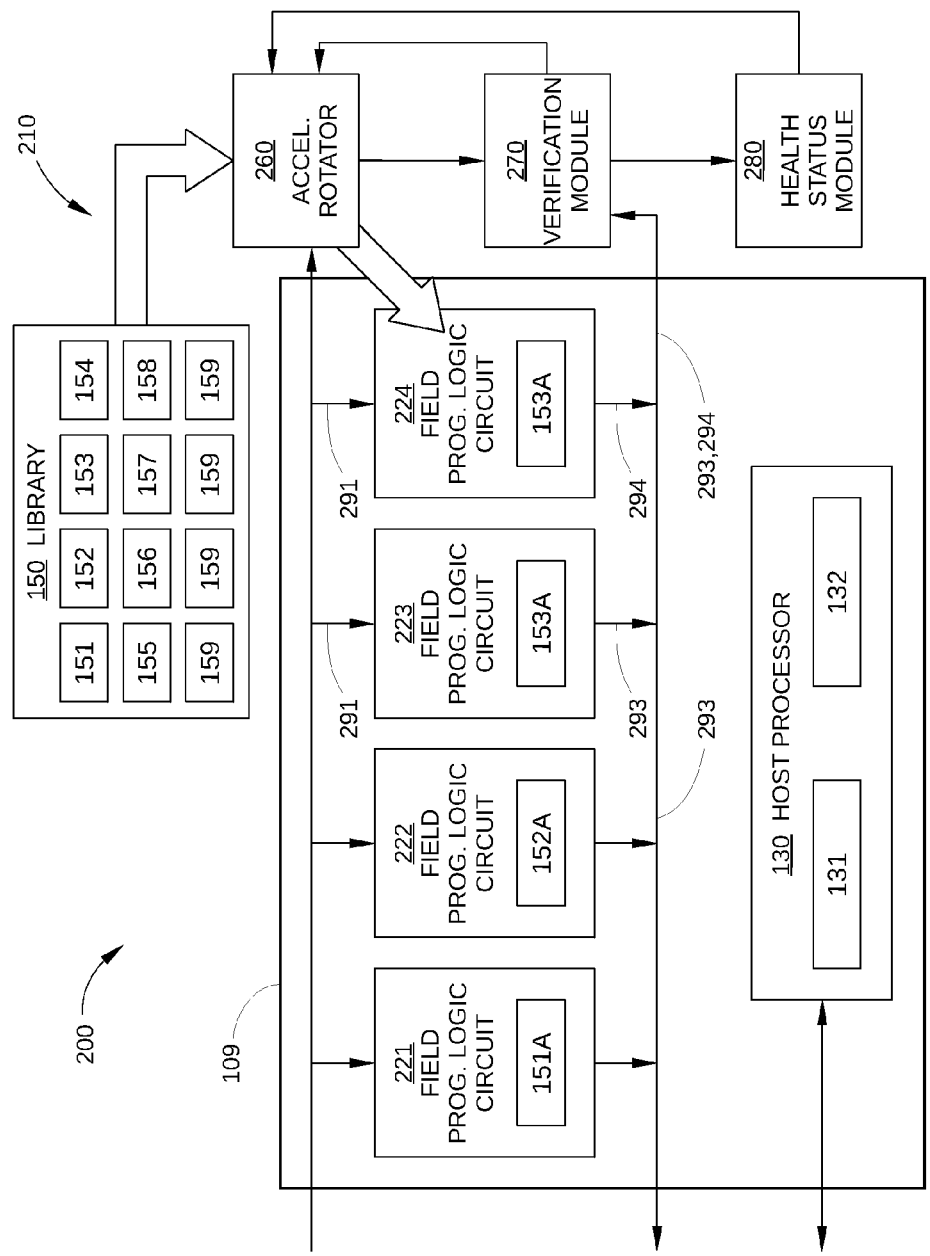
FIG. 2 shows a block diagram of another example embodiment of a chip multiprocessor.

FIG. 2 shows a block diagram of another example embodiment of a CMP 200, arranged in accordance with at least some embodiments of the present disclosure. CMP 200 is a chip multiprocessor that is substantially similar in organization and operation to CMP 100 in FIG. 1, except that CMP 200 does not include a dedicated testing circuit 125. Instead, CMP 200 cycles hardware accelerator images through field-programmable logic circuits 221-224 of CMP 200 for even wear-leveling and periodic refreshing of each hardware accelerator used by CMP 200. Specifically, one of field-programmable logic circuits 221-224 is programmed with a duplicate hardware accelerator image of a hardware accelerator already in use in CMP 200, is brought to the same logic state as the duplicated hardware accelerator, and is then used to replace the duplicated hardware accelerator. Consequently, to facilitate such an embodiment, field-programmable logic circuits 221-224 may be substantially homogeneous in organization and operation.

FIG. 2 also depicts components of an accelerator management system 210 that facilitates implementation of one or more embodiments of the disclosure in conjunction with CMP 200. Accelerator management system 210 may include one or more of a library 150, an accelerator rotator 260, a verification module 270, and a health status module 280, and may be configured to periodically test and repair hardware images programmed into field-programmable logic circuits 221-224 during operation of CMP 200. One or more of the elements of accelerator management system 210 may be implemented as elements formed on integrated circuit die 109, or may reside off-chip. In the embodiment illustrated in FIG. 1, elements of accelerator management system 210 are depicted as off-chip elements. Example embodiments of library 150 are described above in conjunction with FIGS. 1 and 2.

Accelerator rotator 260 is configured to select a hardware accelerator image and program the selected hardware accelerator image into one of field-programmable logic circuits 221-224. The hardware accelerator image selected by accelerator rotator 260 is a hardware accelerator image that is already programmed into one of field-programmable logic circuits 221-224. Thus, after being programmed into an available field-programmable logic circuit in CMP 200, CMP 200 has two of the same hardware accelerators: an original hardware accelerator and a duplicate hardware accelerator. The duplicate hardware accelerator is programmed into the available field programmable logic circuit using the appropriate hardware accelerator package from library 150. For example, in the exemplary embodiment illustrated in FIG. 2, field-programmable logic circuits 221-

223 are programmed with hardware accelerator images 151A-153A, respectively. Based on one or more selection criteria, described below, accelerator rotator 260 selects hardware accelerator image 153A for duplication in field-programmable logic circuit 224. To accomplish this, accelerator rotator 260 selects hardware accelerator package 153 from library 150, which then programs hardware accelerator image 153A into field-programmable logic circuit 224. Thus, CMP 200 is provided with duplicate hardware accelerators programmed with hardware accelerator image 153A, i.e., field-programmable logic circuits 223 and 224.

The selection process used by accelerator rotator 260 to select a particular hardware accelerator image for duplication, as well as which of field-programmable logic circuits is programmed with the duplicate hardware accelerator image, may be based on various criteria. For example, in some embodiments, a particular hardware accelerator may be selected for duplication based on one or more of the following factors: time elapsed since the hardware accelerator was last duplicated, number of operations performed by the hardware accelerator since being duplicated, and if an error is experienced by an application associated with the hardware accelerator, among others. Which of field-programmable logic circuits 221-224 that accelerator rotator 260 selects to program with the duplicate hardware accelerator image may be based on which of field-programmable logic circuits 221-224 is currently available, the number of times each of field-programmable logic circuits 221-224 has been programmed, etc. Wear-leveling can be performed by accelerator management system 210 by programming the duplicate hardware accelerator image in an available field-programmable logic circuit that has been reprogrammed the fewest number of times. Thus, accelerator rotator 260 implements wear-leveling with respect to the number of times field-programmable logic circuits 221-224 are reprogrammed, which is an important consideration for programmable logic circuits that can be reprogrammed a limited number of times, such as EEPROM-based logic circuits. In yet other embodiments, a hardware accelerator image is duplicated when the computing device that includes CMP 200 is connected to a power supply external to the computing device, which is particularly advantageous when said computing device comprises a mobile computing device. It is noted that any combination of the above-described selection criteria, as well as other selection criteria, may be used by accelerator rotator 260 without exceeding the scope of the disclosure.

Verification module 270 is configured to perform a verification process confirming that the operation of the original hardware accelerator is error-free and matches that of the duplicate hardware accelerator. Once the operation of the original hardware accelerator matches that of the duplicate hardware accelerator, verification module 270 notifies health status module 280, and the duplicate hardware accelerator is used to replace the original hardware accelerator. In this way, hardware accelerators can be "refreshed" periodically with a newly programmed hardware accelerator during normal operation of CMP 200 with no impact on the operation or performance of CMP 200. In this way, faults due to the many wear-out mechanisms associated with programmable logic circuits can be avoided. If the operation of the original hardware accelerator does not match the duplicate hardware accelerator, verification module 270 notifies health status module 280 so that device failure rates can be tracked.

An exemplary embodiment of the verification process is illustrated in FIG. 2, in which identical inputs 291 are provided to the original hardware accelerator, i.e., field-programmable logic circuit 223, and the duplicate hardware accelerator, i.e., field-programmable logic circuit 224. Verification module 270 compares outputs 293 from field-programmable logic circuit 223 to outputs 294 from field-programmable logic circuit 224. In some embodiments, inputs 291 may be inputs provided to field-programmable logic circuit 223 as part of the normal operation of CMP 200. In such embodiments, outputs 293 are used by CMP 200 to run a portion of an application until field-programmable logic circuit 223 is replaced by field-programmable logic circuit 224. Verification module 270 notifies health status module 280 when outputs 293 and 294 are identical and field-programmable logic circuit 223 can be replaced by field-programmable logic circuit 224.

In some embodiments, verification module 270 compares outputs 293 and 294 after field-programmable logic circuit 224 is placed in the same logic state as field-programmable logic circuit 223. As noted above for some embodiments of CMP 100, a relatively small number of inputs, e.g., 2-10, may be needed to bring field-programmable logic circuit 224 to the same logic state as field-programmable logic circuit 223. In some embodiments, a predetermined number of identical inputs 291 is provided to field-programmable logic circuits 223 and 224 before verification module 270 compares outputs 293 to outputs 294. The predetermined number may be selected to provide a desired level of statistical confidence that field-programmable logic circuits 223 and 224 are both in identical logic states.

Health status module 280 is configured to update the operation of CMP 200 to use the duplicate version of hardware accelerators once error-free operation thereof has been verified. In addition, based on the verification process performed by verification module 270, health status module may update the health status of field-programmable logical circuits 221-224 and take any necessary corrective action. For example, when verification unit 270 determines outputs 293 and 294 to be identical, health status module 280 may indicate the health status of field-programmable logic circuit 223 is healthy in a health status table and notify accelerator rotator 260 that field-programmable logic circuit 223 can be replaced with field-programmable logic circuit 224. In addition, because field-programmable logic circuit 223 is determined to be functioning correctly, field-programmable logic circuit 223 may be subsequently reprogrammed by accelerator rotator 260 for duplicating a different hardware accelerator in CMP 200. When verification unit 270 determines outputs 293 and 294 to be different, health status module 280 may notify accelerator rotator 260 to reprogram field-programmable logic circuit 224 to retest field-programmable logic circuits 223 and/or 224. If verification unit 270 continues to detect discrepancies between outputs 293 and 294, health state module 280 may indicate that field-programmable logic circuits 223 and/or 224 are not valid for use and should undergo additional testing procedures or other corrective action, if available as described below.

In some embodiments, such additional testing procedures may include using a third field-programmable logic circuit, for example field-programmable logic circuit 222, to compare the outputs of field-programmable logic circuits 223 and 224 to determine which is having the failure and flag the failure in the health status. Alternately, if field-programmable logic circuit 224 is available when discrepancies between outputs 293 and 294 are detected, field-programmable logic circuit 224 can be reprogrammed and outputs 293 and 294 may again be compared. If the disagreement persists, then field-programmable logic circuit 224 may be identified as the source of the error. Other testing procedure may also be used without exceeding the scope of the invention.

Figure 3:
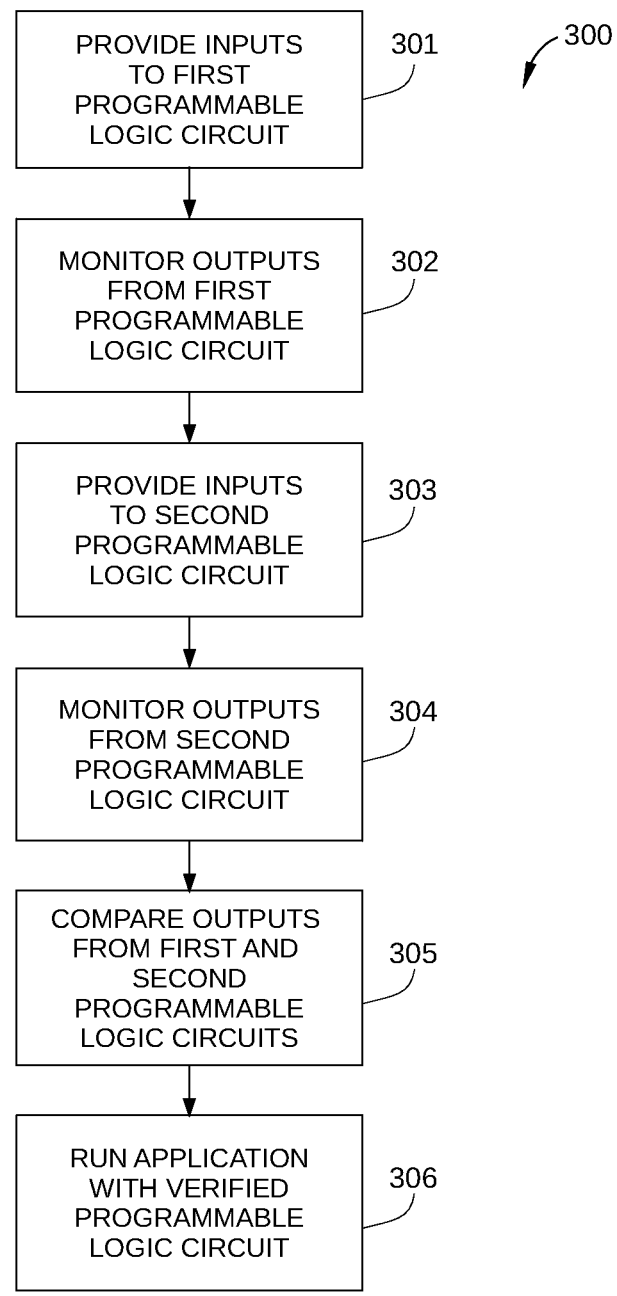
FIG. 3 sets forth a flowchart summarizing an example method for the testing and repair of a hardware accelerator image in a programmable logic circuit.

FIG. 3 sets forth a flowchart summarizing an example method 300 for the testing and repair of a hardware accelerator image in a programmable logic circuit, in accordance with at least some embodiments of the present disclosure. Method 300 may include one or more operations, functions, or actions as illustrated by one or more of blocks 301-306. Although the blocks are illustrated in a sequential order, these blocks may also be performed in parallel, and/or in a different order than those described herein. Also, the various blocks may be combined into fewer blocks, divided into additional blocks, and/or eliminated based upon the desired implementation.

For ease of description, method 300 is described in terms of CMPs substantially similar to CMPs 100 and 200 and hardware accelerator management systems substantially similar to accelerator management systems 110 in FIGS. 1 and 210 in FIG. 2. It is noted that method 300 may be performed by other configurations of CMPs and still fall within the scope of the present disclosure. Prior to the first operation of method 300, one or more applications and associated hardware accelerator packages 151-158 may be loaded onto the host computing device that includes CMP 100. Furthermore, at least one of field-programmable logic circuits 121-123 of CMP 100 (or field-programmable logic circuits 221-223 of CMP 200) is loaded with a hardware accelerator image, configuring the at least one programmed field-programmable logic circuits as a hardware accelerator. In addition, a duplicate hardware accelerator is programmed with the same hardware accelerator image. In some embodiments, the duplicate hardware accelerator image is programming into a testing circuit, such as testing circuit 125 in FIG. 1, and in other embodiments, the duplicate hardware accelerator image is programmed into any available field-programmable logic circuit, such as field-programmable logic circuit 224 in FIG. 2.

Method 300 may begin in block 301 "PROVIDE INPUTS TO FIRST PROGRAMMABLE LOGIC CIRCUIT." Block 301 may be followed by block 302 "MONITOR OUTPUTS FROM FIRST PROGRAMMABLE LOGIC CIRCUIT," block 302 may be followed by block 303 "PROVIDE INPUTS TO SECOND PROGRAMMABLE LOGIC CIRCUIT," block 303 may be followed by block 304 "MONITOR OUTPUTS FROM SECOND PROGRAMMABLE LOGIC CIRCUIT," block 304 may be followed by block 305 "COMPARE OUTPUTS FROM FIRST AND SECOND PROGRAMMABLE LOGIC CIRCUITS," and block 305 may be followed by block 306 "RUN APPLICATION WITH VERIFIED PROGRAMMABLE LOGIC CIRCUIT."

In block 301, an accelerator management system associated with a CMP, such as accelerator management system 110 or 210, provides inputs to a first programmable logic circuit of the processor that is programmed with an accelerator program associated with the application, such as a hardware accelerator image. The inputs, e.g., inputs 191 in FIG. 1 or 291 in FIG. 2, may be associated with an application running on the CMP.

In block 302, the accelerator management system monitors outputs from the first programmable logic circuit that result from providing the inputs, e.g., outputs 193 in FIG. 1 or outputs 293 in FIG. 2. In some embodiments, said outputs that are monitored in block 302 may also be used by the CMP to run at least a portion of the associated application.

In block 303, the accelerator management system provides inputs to a second programmable logic circuit of the CMP that is also programmed with the accelerator program. The inputs are identical to the inputs provided to the first programmable logic circuit in block 301. In some embodiments, the second programmable logic circuit comprises a dedicated testing circuit.

In block 304, the accelerator management system monitors outputs from the second programmable logic circuit that result from providing the inputs to the second programmable logic circuit.

In block 305, the accelerator management system compares the outputs from the first programmable logic circuit to the outputs from the second programmable logic circuit, in order to verify error-free operation of said programmable logic circuits. In some embodiments, the second programmable logic circuit may comprise a testing circuit, such as testing circuit 125 in FIG. 1, and is used to verify error-free operation of the first programmable logic circuit. In such an embodiment, comparison of the outputs of the two programmable logic circuits can be used to detect faults in the first programmable logic circuit caused by one or more wear-out mechanisms associated with programmable logic circuits. In other embodiments, the second programmable logic circuit may comprise any of the programmable logic circuits of the CMP and, after error-free operation is verified in block 305, may be used to replace the first programmable logic circuit. In some embodiments, a verification module in the accelerator management system is used to perform block 305. In some embodiments, the comparison is performed in block 305 after the second programmable logic circuit is brought to the same logic state as the first programmable logic circuit.

In block 306, based on the comparison of the outputs performed in block 305, the accelerator maintenance system either continues to run the application with one of the verified programmable logic circuits, or takes corrective action. In embodiments in which the second programmable logic circuit comprises a testing circuit, the second programmable logic circuit may be programmed with a different accelerator program when the verification process in block 305 indicates error-free operation. The testing circuit can then be used to test a different hardware accelerator in the CMP, and the first programmable logic circuit can continue to be used in the CMP to run a portion of the application. In embodiments in which the second programmable logic circuit is not a programmable logic circuit dedicated to testing, the second programmable logic circuit may be used to replace the first programmable logic circuit. In such embodiments, the refreshed version of the hardware accelerator provided by the second programmable logic circuit avoids faults caused by wear-out mechanisms associated with programmable logic circuits.

In some embodiments, test vectors may be used in conjunction with periodic testing of programmable logic circuits programmed as hardware accelerators in a CMP. In this way, error-free operation of the hardware accelerators can be ensured when test vectors are available for the hardware accelerator images programmed into the programmable logic circuits of the CMP. Such test vectors 159 may be stored in library 150 in FIGS. 1 and 2 and utilized by an accelerator maintenance system similar to accelerator maintenance system 110 in FIG. 1 or accelerator maintenance system 210 in FIG. 2.

Figure 4:
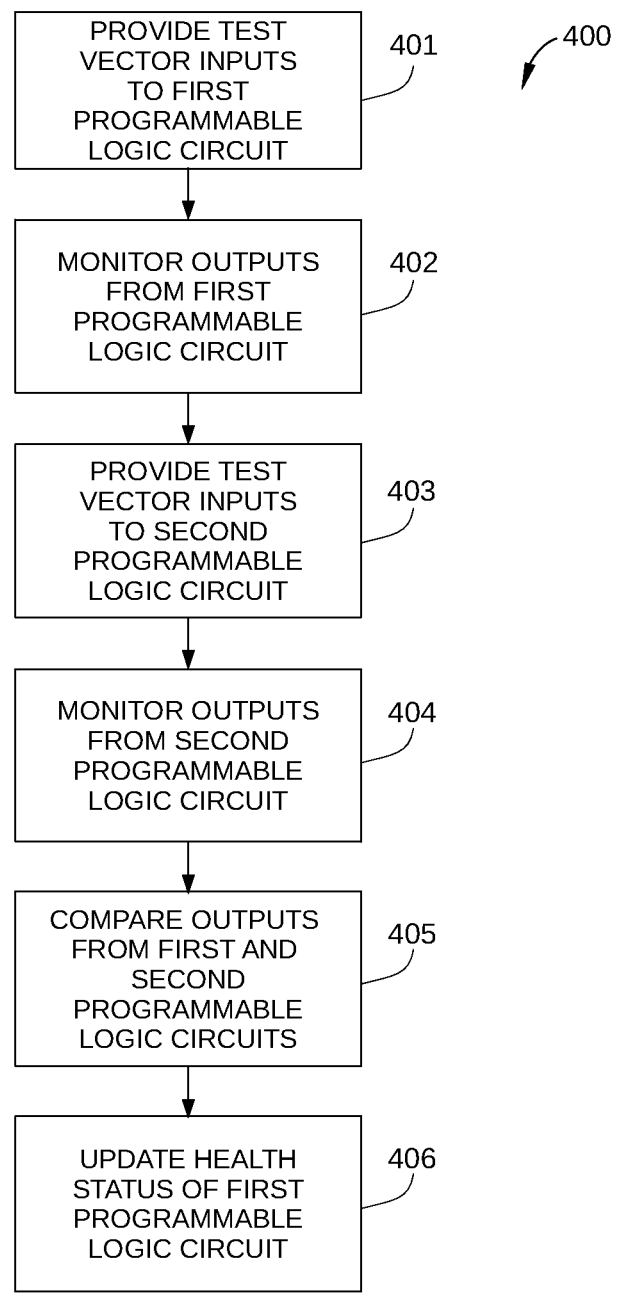
FIG. 4 sets forth a flowchart summarizing an example method for the testing and repair of a hardware accelerator image in a programmable logic circuit.

FIG. 4 sets forth a flowchart summarizing an example method 400 for the testing and repair of a hardware accelerator image in a programmable logic circuit, in accordance with at least some embodiments of the present disclosure. Method 400 may include one or more operations, functions, or actions as illustrated by one or more of blocks 401-406. Although the blocks are illustrated in a sequential order, these blocks may also be performed in parallel, and/or in a different order than those described herein. Also, the various blocks may be combined into fewer blocks, divided into additional blocks, and/or eliminated based upon the desired implementation.

For ease of description, method 400 is described in terms of a CMP substantially similar to CMP 200 and hardware accelerator management system 210 in FIG. 2. One of skill in the art will appreciate that method 400 may be performed by other configurations of CMPs and still fall within the scope of the present disclosure. Prior to the first operation of method 400, one or more applications and associated hardware accelerator packages 151-158 may be loaded onto the host computing device that includes CMP 200. Furthermore, at least one of field-programmable logic circuits 221-224 of CMP 200 is loaded with a hardware accelerator image, so that the at least one programmed field-programmable logic circuit is configured as a hardware accelerator. In addition, a duplicate hardware accelerator is programmed with the same hardware accelerator image. The duplicate hardware accelerator image may be programmed into any available field-programmable logic circuit of CMP 200, such as field-programmable logic circuit 224 in FIG. 2.

Method 400 may begin in block 401 "provide test vector inputs to first programmable logic circuit." Block 401 may be followed by block 402 "monitor outputs from first programmable logic circuit," block 402 may be followed by block 403 "provide test vector inputs to second programmable logic circuit," block 403 may be followed by block 404 "monitor outputs from second programmable logic circuit," block 404 may be followed by block 405 "compare outputs from first and second programmable logic circuits," and block 405 may be followed by block 406 "update health status of first programmable logic circuit."

In block 401, an accelerator management system associated with a CMP, such as accelerator management system 210, provides a test vector to a first programmable logic circuit of the processor that is programmed with an accelerator program, such as a hardware accelerator image, associated with the application. Test vector 159 is a specifically designed set of inputs for testing the particular hardware accelerator image programmed into the first programmable logic circuit, and may be stored in library 150.

In block 402, the accelerator management system monitors outputs from the first programmable logic circuit that result from providing the test vector 159. In some embodiments, the first programmable logic circuit may not be available for use by CMP 200 during execution of block 402.

In block 403, the accelerator management system provides test vector 159 to a second programmable logic circuit of the CMP that is also programmed with the accelerator program. Generally, test vector 159 may be identical to the inputs provided to the first programmable logic circuit in block 401.

In block 404, the accelerator management system monitors outputs from the second programmable logic circuit that result from providing test vector 159 to the second programmable logic circuit.

In block 405, the accelerator management system compares the outputs from the first programmable logic circuit to the outputs from the second programmable logic circuit, in order to verify error-free operation of said programmable logic circuits. In some embodiments, comparison of the outputs of the two programmable logic circuits can be used to detect faults in the first programmable logic circuit caused by one or more wear-out mechanisms associated with programmable logic circuits. In some embodiments, once error-free operation of the first and second programmable logic circuits is verified in block 405, the second programmable logic circuit may be used to replace the first programmable logic circuit. In some embodiments, a verification module in the accelerator management system is used to perform block 405. In some embodiments, the comparison is performed in block 405 after the second programmable logic circuit is brought to the same logic state as the first programmable logic circuit.

In block 406, based on the comparison of the outputs performed in block 405, the accelerator maintenance system updates the health status of the first programmable logic circuit. If the first programmable logic circuit is determined to have one or more errors in block 405, the health status thereof is updated to indicate that the first programmable logic circuit is currently not available for reprogramming and/or that further testing should be performed thereon. If the first programmable logic circuit is determined to be operating error-free in block 405, the accelerator maintenance system replaces the first programmable logic circuit with the second programmable logic circuit, providing a refreshed version of the hardware accelerator that avoids faults caused by wear-out mechanisms associated with programmable logic circuits.

Figure 5:
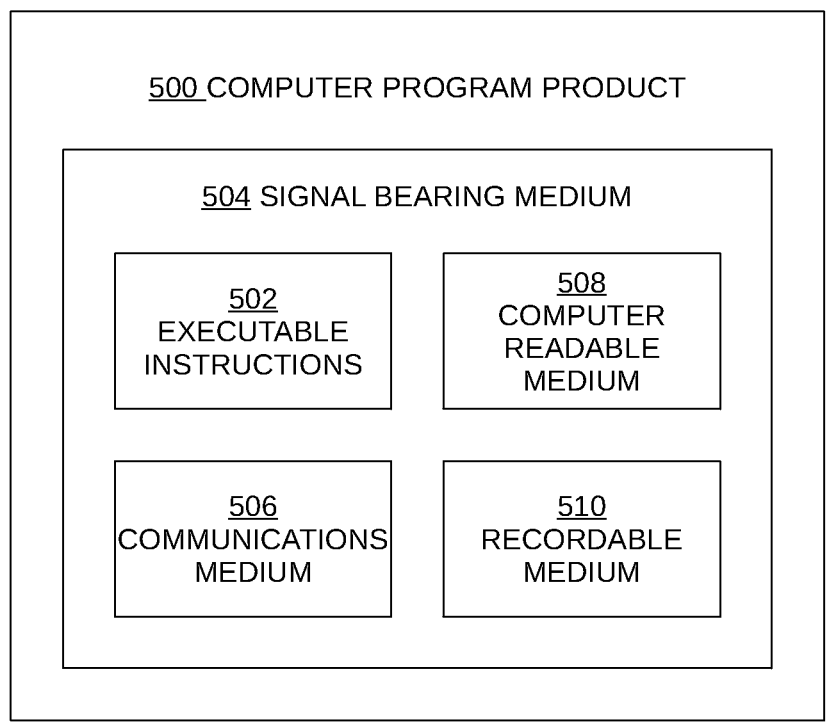
FIG. 5 is a block diagram of an illustrative embodiment of a computer program product for implementing a method for the testing and repair of a hardware accelerator image in a programmable logic circuit.

FIG. 5 is a block diagram of an illustrative embodiment of a computer program product 500 for implementing a method for the testing and repair of a hardware accelerator image in a programmable logic circuit, arranged in accordance with at least some embodiments of the present disclosure. Computer program product 500 may include a signal bearing medium 504. Signal bearing medium 504 may include one or more sets of executable instructions 502 that, when executed by, for example, a processor of a computing device, may provide at least the functionality described above with respect to FIGS. 3 and 4.

In some implementations, signal bearing medium 504 may encompass a non-transitory computer readable medium 508, such as, but not limited to, a hard disk drive, a Compact Disc (CD), a Digital Video Disk (DVD), a digital tape, flash memory, etc. In some implementations, signal bearing medium 504 may encompass a recordable medium 510, such as, but not limited to, memory, read/write (R/W) CDs, R/W DVDs, etc. In some implementations, signal bearing medium 504 may encompass a communications medium 506, such as, but not limited to, a digital and/or an analog communication medium (e.g., a fiber optic cable, a waveguide, a wired communications link, a wireless communication link, etc.). Computer program product 500 may be recorded on non-transitory computer readable medium 508 or another similar recordable medium 510.

Figure 6:
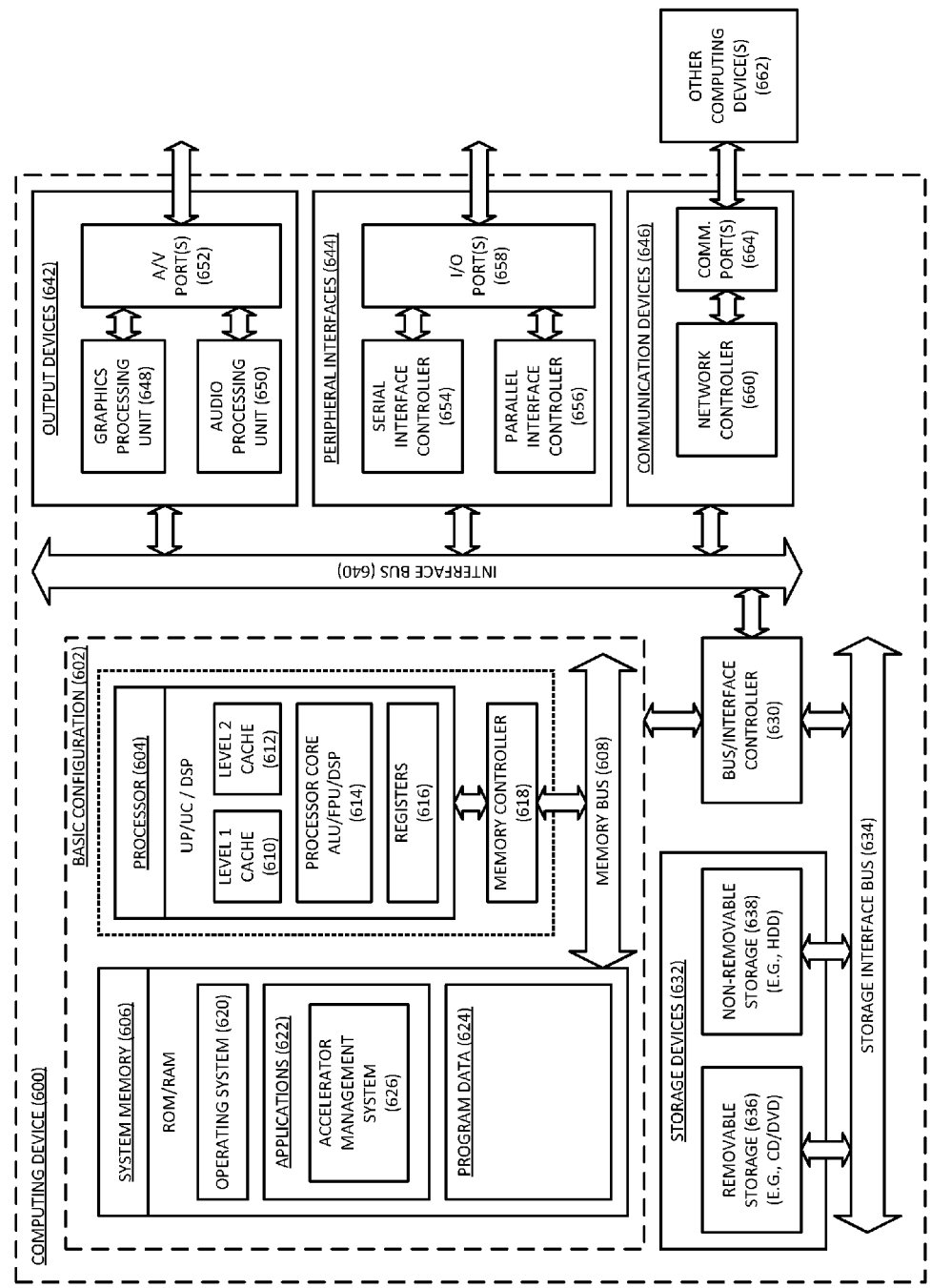
FIG. 6 is a block diagram illustrating an example computing device 600 that is arranged for monitoring control data, all arranged in accordance with at least some embodiments of the present disclosure.

FIG. 6 is a block diagram illustrating an example computing device 600 that is arranged for monitoring control data, according to at least some embodiments of the present disclosure. In a very basic configuration 602, computing device 600 typically includes one or more processors 604 and a system memory 606. A memory bus 608 may be used for communicating between processor 604 and system memory 606.

Depending on the desired configuration, processor 604 may be of any type including but not limited to a microprocessor (μP), a microcontroller (μC), a digital signal processor (DSP), or any combination thereof. Processor 604 may include one more levels of caching, such as a level one cache 610 and a level two cache 612, a processor core 614, and registers 616. An example processor core 614 may include an arithmetic logic unit (ALU), a floating point unit (FPU), a digital signal processing core (DSP Core), or any combination thereof. An example memory controller 618 may also be used with processor 604, or in some implementations memory controller 618 may be an internal part of processor 604.

Depending on the desired configuration, system memory 606 may be of any type including but not limited to volatile memory (such as RAM), non-volatile memory (such as ROM, flash memory, etc.) or any combination thereof. System memory 606 may include an operating system 620, one or more applications 622, and program data 624. Application 622 may include accelerator management system 626, similar to accelerator management system 110 of FIG. 1, arranged to perform at least the functions as those described with respect to method 300 of FIG. 3 and/or method 400 of FIG. 4. Program data 624 may be useful for operation with accelerator management system 626 as is described herein. In some embodiments, application 622 may be arranged to operate with program data 624 on operating system 620. This described basic configuration 602 is illustrated in FIG. 6 by those components within the inner dashed line.

Computing device 600 may have additional features or functionality, and additional interfaces to facilitate communications between basic configuration 602 and any required devices and interfaces. For example, a bus/interface controller 630 may be used to facilitate communications between basic configuration 602 and one or more data storage devices 632 via a storage interface bus 634. Data storage devices 632 may be removable storage devices 636, non-removable storage devices 638, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 606, removable storage devices 636 and non-removable storage devices 638 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 600. Any such computer storage media may be part of computing device 600.

Computing device 600 may also include an interface bus 640 for facilitating communication from various interface devices (e.g., output devices 642, peripheral interfaces 644, and communication devices 646) to basic configuration 602 via bus/interface controller 630. Example output devices 642 include a graphics processing unit 648 and an audio processing unit 650, which may be configured to communicate to various external devices such as a display or speakers via one or more A/V ports 652. Example peripheral interfaces 644 include a serial interface controller 654 or a parallel interface controller 656, which may be configured to communicate with external devices such as input devices (e.g., keyboard, mouse, pen, voice input device, touch input device, etc.) or other peripheral devices (e.g., printer, scanner, etc.) via one or more I/O ports 658. An example communication device 646 includes a network controller 660, which may be arranged to facilitate communications with one or more other computing devices 662 over a network communication link, such as, without limitation, optical fiber, Long Term Evolution (LTE), 3G, WiMax, via one or more communication ports 664.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 600 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 600 may also be implemented as a personal computer including both laptop computer and non-laptop computer configurations.

In sum, embodiments of the present disclosure provide systems and methods for the testing and repair of a hardware accelerator image in a programmable logic circuit. Specifically, in a processor chip that includes multiple programmable logic circuits, a hardware accelerator image programmed into a first programmable logic circuit is tested by programming a testing circuit with a duplicate hardware accelerator image, bringing the testing circuit to the same logic state as the first programmable logic circuit, and comparing outputs from the first programmable logic circuit and the testing circuit. Such testing can be performed on any hardware accelerator in a programmable logic circuit of the processor chip without the disadvantage of affecting operation of the processor chip. In addition, such embodiments advantageously provide even wear-leveling and periodic refreshing of hardware accelerators in a processor chip. Furthermore, no test vectors or redundant logic circuits are required for such hardware accelerator testing.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I claim:

1. In a processor that includes multiple programmable logic circuits and that is configured to run an application, a method to manage operation of the multiple programmable logic circuits, the method comprising:
   selecting a hardware accelerator image for duplication based on one or more of: time elapsed since the hardware accelerator image was last duplicated, a number of operations performed by the hardware accelerator image since being duplicated, and whether an error is experienced by a particular application associated with the hardware accelerator image;
   duplicating the selected hardware accelerator image;
   providing one or more inputs, associated with the application, to a first programmable logic circuit that is programmed with the selected hardware accelerator image;
   monitoring outputs from the first programmable logic circuit, wherein the outputs from the first programmable logic circuit result from operation of the hardware accelerator image with the first programmable logic circuit using the one or more inputs associated with the application, and wherein the outputs from the first programmable logic circuit are used by the processor to run the application;
   providing the one or more inputs, associated with the application, to a second programmable logic circuit that is programmed with the duplicate hardware accelerator image;
   monitoring outputs from the second programmable logic circuit, wherein the outputs from the second programmable logic circuit result from operation of the duplicate hardware accelerator image with the second programmable logic circuit using the one or more inputs associated with the application;
   comparing the outputs from the first programmable logic circuit with the outputs from the second programmable logic circuit;
   based on the comparison of the outputs from the first programmable logic circuit with the outputs from the second programmable logic circuit, determining an operational status of the first programmable logic circuit and the second programmable logic circuit that have been programmed with the selected hardware accelerator image and the duplicate hardware accelerator image, respectively;
   storing the determined operational status; and
   using, by the processor, the outputs from the second programmable logic circuit to run the application in response to a determination that operation of the first programmable logic circuit is error-free.

2. The method of claim 1, further comprising:
   after determining the operational status of the second programmable logic circuit, programming the first programmable logic circuit with a different hardware accelerator image.

3. The method of claim 2, wherein the application includes a first application, and wherein the different hardware accelerator image is associated with a second application that is being run by the processor.

4. The method of claim 1, wherein the outputs from the second programmable logic circuit are used to run the application after the second programmable logic circuit has a same logic state as the first programmable logic circuit.

5. The method of claim 4, wherein comparing the outputs from the first programmable logic circuit with the outputs from the second programmable logic circuit comprises determining the logic state of the second programmable logic circuit.

6. The method of claim 1, further comprising placing the second programmable logic circuit to a same logic state as the first programmable logic circuit by providing a particular number of inputs to the second programmable logic circuit that are identical to the one or more inputs provided to the first programmable logic circuit.

7. The method of claim 1, wherein providing the one or more inputs to the second programmable logic circuit is performed in response to detection of coupling of a computing device that includes the processor to a power supply external to the computing device.

8. The method of claim 1, wherein providing the one or more inputs to the second programmable logic circuit is initiated in response to a determination by the processor that an error associated with the application has occurred.

9. The method of claim 1, further comprising:
   in response to a determination that the outputs from the first programmable logic circuit fail to match the outputs from the second programmable logic circuit, designating the determined operational status of the first programmable logic circuit as invalid for use.

10. The method of claim 9, further comprising performing additional testing on the first programmable logic circuit.

11. The method of claim 1, further comprising:
    prior to providing the one or more inputs to the second programmable logic circuit, selecting the second programmable logic circuit from a plurality of programmable logic circuits, wherein the selection of the second programmable logic circuit is based on a number of times that the second programmable logic circuit has been reprogrammed.

12. The method of claim 1, wherein the one or more inputs are provided to the first programmable logic circuit and the second programmable logic circuit at a first time, and wherein the method further comprises:
    providing the one or more inputs to the first programmable logic circuit and the second programmable logic circuit for at least a second time;
    monitoring outputs from the first programmable logic circuit and the second programmable logic circuit that respectively result from operation of the hardware accelerator image with the first programmable circuit and the duplicate hardware accelerator image with the second programmable logic circuit, using the one or more inputs for the at least second time; and
    based on a comparison of the outputs from the first programmable logic circuit with the second programmable logic circuit that respectively result from the operation of the hardware accelerator image with the first programmable logic circuit and the duplicate hardware accelerator image with the second programmable logic circuit, using the one or more inputs for the at least second time, determining the operational status of at least one of the first programmable logic circuit and the second programmable logic circuit.

13. In a processor that includes multiple programmable logic circuits and that is configured to run an application, a method to manage operation of the multiple programmable logic circuits, the method comprising:
    selecting a hardware accelerator image for duplication based on one or more of: time elapsed since the hardware accelerator image was last duplicated, a number of operations performed by the hardware accelerator image since being duplicated, and whether an error is experienced by a particular application associated with the hardware accelerator image;

duplicating the selected hardware accelerator image;

providing one or more inputs, associated with the application, to a first programmable logic circuit of the processor that is programmed with the selected hardware accelerator image;

monitoring outputs from the first programmable logic circuit, wherein the outputs from the first programmable logic circuit result from operation of the hardware accelerator image with the first programmable logic circuit using the one or more inputs associated with the application, and wherein the outputs from the first programmable logic circuit are used by the processor to run the application;

providing the one or more inputs to a second programmable logic circuit that is programmed with the duplicate hardware accelerator image;

monitoring outputs from the second programmable logic circuit, wherein the outputs from the second programmable logic circuit result from operation of the duplicate hardware accelerator image with the second programmable logic circuit using the one or more inputs associated with the application;

comparing the outputs from the first programmable logic circuit with the outputs from the second programmable logic circuit in response to a determination that the second programmable logic circuit is in a same logic state as that of the first programmable logic circuit, wherein the logic state of the first programmable logic circuit and the second programmable logic circuit is a function of the one or more inputs provided to the first programmable logic circuit and the second programmable logic circuit;

based on the comparison of the outputs from the first programmable logic circuit with the outputs from the second programmable logic circuit, determining an operational status of the first programmable logic circuit and the second programmable logic circuit; and in response to the determination of the operational status of the first programmable logic circuit and the second programmable logic state, programming the second programmable logic circuit with a different hardware accelerator image.

14. The method of claim 13, wherein the first programmable logic circuit comprises a flash-programmed logic circuit.

15. The method of claim 13, further comprising:
based on the comparison of the outputs from the first programmable logic circuit with the outputs from the second programmable logic circuit, updating the operational status of the first programmable logic circuit.

16. The method of claim 13, wherein providing the one or more inputs to the second programmable logic circuit of the processor occurs periodically.

17. The method of claim 16, wherein providing the one or more inputs to the second programmable logic circuit periodically comprises providing the one or more inputs to the second programmable logic circuit after a particular time interval and/or after the first programmable logic circuit has performed a particular number of operations.

18. The method of claim 13, wherein providing the one or more inputs to the second programmable logic circuit is performed in response to coupling a computing device that includes the processor to a power supply external to the computing device.

19. The method of claim 13, wherein providing the one or more inputs to the second programmable logic circuit is performed in response to the processor having experienced an error.

20. In a processor that includes multiple programmable logic circuits, a method to test an accelerator program that is programmed into one of the multiple programmable logic circuits, the method comprising:

selecting a hardware accelerator image for duplication based on one or more of: time elapsed since the hardware accelerator image was last duplicated, a number of operations performed by the hardware accelerator image since being duplicated, and whether an error is experienced by a particular application associated with the hardware accelerator image;

duplicating the selected hardware accelerator image;

providing test vector inputs to a first programmable logic circuit that is programmed with the selected hardware accelerator image;

monitoring outputs from the first programmable logic circuit, wherein the outputs from the first programmable logic circuit result from operation of the first programmable logic circuit using the test vector inputs;

providing the test vector inputs to a second programmable logic circuit that is programmed with the duplicate hardware accelerator image;

monitoring outputs from the second programmable logic circuit, wherein the outputs from the second programmable logic circuit result from operation of the second programmable logic circuit using the test vector inputs;

comparing the outputs from the first programmable logic circuit with the outputs from the second programmable logic circuit in response to a determination that the second programmable logic circuit is in a same logic state as that of the first programmable logic circuit, wherein the logic state of the first programmable logic, circuit is different from an operational status of the first programmable logic circuit, and wherein the logic state of the second programmable logic circuit is different from an operational status of the second programmable logic circuit; and based on the comparison of the outputs from the first programmable logic circuit with the outputs from the second programmable logic circuit, updating a health status of the first programmable logic circuit.

21. The method of claim 20, further comprising:
based on the comparison of the outputs from the first programmable logic circuit with the outputs from the second programmable logic circuit, programming the first programmable logic circuit with a different hardware accelerator image, and using the outputs from the first programmable logic circuit to run an application on the processor.

22. The method of claim 20, further comprising:
based on the comparison of the outputs from the first programmable logic circuit with the outputs from the second programmable logic circuit, programming the second programmable logic circuit with a different hardware accelerator image, and using the outputs from the second programmable logic circuit to run an application on the processor.

* * * * *